(12) United States Patent
Zhang (10) Patent No.: US 7,952,903 B2
(45) Date of Patent: May 31, 2011

(54) MULTIMEDIA THREE-DIMENSIONAL MEMORY MODULE (M3DMM) SYSTEM

(76) Inventor: Guobiao Zhang, Carson City, NV (US)

( * ) Notice: Subject to any disclaimer, the term of this patent is extended or adjusted under 35 U.S.C. 154(b) by 1062 days.

(21) Appl. No.: 11/736,777

(22) Filed: Apr. 18, 2007

(65) Prior Publication Data

US 2008/0056683 A1    Mar. 6, 2008

Related U.S. Application Data

(60) Provisional application No. 60/767,573, filed on Aug. 30, 2006, provisional application No. 60/889,537, filed on Feb. 12, 2007.

(30) Foreign Application Priority Data

Dec. 8, 2006    (CN) .......................... 2006 1 0022444

(51) Int. Cl.
*G11C 5/02*    (2006.01)

(52) U.S. Cl. .............................. 365/51; 365/45; 365/211
(58) Field of Classification Search .................... 365/51, 365/45, 211
See application file for complete search history.

(56) References Cited

U.S. PATENT DOCUMENTS

| | | | | |
|---|---|---|---|---|
| 5,815,425 | A | * | 9/1998 | Wong et al. ..................... 365/45 |
| 5,835,396 | A | * | 11/1998 | Zhang ............................. 365/51 |
| 6,789,192 | B2 | * | 9/2004 | Hirota et al. ................... 713/172 |
| 6,954,394 | B2 | * | 10/2005 | Knall et al. .................... 365/211 |
| 2008/0159722 | A1 | * | 7/2008 | Zhang ............................ 386/124 |
| 2008/0162850 | A1 | * | 7/2008 | Zhang ............................ 711/163 |
| 2009/0070214 | A1 | * | 3/2009 | Zhang ............................. 705/14 |

* cited by examiner

*Primary Examiner* — Pho M Luu (57) ABSTRACT

Multimedia three-dimensional memory module (M3DMM) is an ideal storage for pre-recorded multimedia library (PML). Among all semiconductor storage technologies, $(3D)^2$-MM (i.e. three-dimensional memory-based M3DMM), particularly mask-programmable $(3D)^2$-MM, has the largest storage capacity and is the only one that can store a pre-recorded movie library (PmL) at a reasonable price.

20 Claims, 8 Drawing Sheets

TABLE 1. lists the storage capacity of a single memory chip.

| Year | Node | flash Chip | 3D-M chip | |
|---|---|---|---|---|
| | | | 3D-EPM | 3D-MPM |
| 2007 | 50nm | 2GB | ~6GB | ~16GB |
| 2011 | 35nm | 4GB | ~12GB? | ~32GB |
| 2015 | 25nm | 8GB? | ~12GB? | ~64GB |
| 2020 | 17nm | 8GB? | ~12GB? | ~128GB |

TABLE 2. lists the storage capacity of three-dimensonal memory module (3D-MM)

| Year | Node | xM | 3D-flash module | $(3D)^2$-MM | |
|---|---|---|---|---|---|
| | | | | $(3D)^2$-EPMM | $(3D)^2$-MPMM |
| 2007 | 50nm | x4 | 8GB | ~24GB | ~64GB |
| 2011 | 35nm | x8 | 32GB | ~96GB? | ~256GB |
| 2015 | 25nm | x8 | 64GB? | ~96GB? | ~512GB |
| 2020 | 17nm | x8 | 64GB | ~96GB? | ~1TB |

Table 3. lists the number of movies in several genres at Movielink and their storage requirements

| GENRE | Number of Movies | Storage Requirement |
|---|---|---|
| Action | 262 | ~130GB |
| Drama | 414 | ~200GB |
| Family | 236 | ~120GB |
| Comedy | 398 | ~200GB |
| TV Series | 317 | ~160GB |
| Documentary | 206 | ~100GB |
| ... ... | ... ... | ... ... |
| Total | 1888 | ~1TB |

MULTIMEDIA THREE-DIMENSIONAL MEMORY MODULE (M3DMM) SYSTEM

CROSS-REFERENCE TO RELATED APPLICATIONS

This application is related to U.S. Patent Application No. 60/767,573, "Three-Dimensional Memory Module (3D-MM) Excelling Contemporary Micro-Drive (CMD)", filed Aug. 30, 2006 and U.S. Patent Application No. 60/889,537, "Mobile Mass Storage Containing a pre-Recorded Multimedia Library and Advertisements", filed Feb. 12, 2007. This application is also related to China, P. R. Patent Application 200610022444.0, "Pre-Recorded Three-Dimensional Memory Module and Its Playback System", filed Dec. 8, 2006.

BACKGROUND

1. Technical Field of the Invention

The present invention relates to the field of integrated circuit, and more particularly to semiconductor memory.

2. Related Arts

Consumers desire to access as much multimedia contents as possible while on the go. To satisfy this desire, various multimedia-distribution models have been disclosed. One model is the "download" model, i.e. multimedia contents are wirelessly downloaded by a mobile user from the internet. However, at present or in the near future, fast, pervasive and reliable wireless internet access is not readily available. This makes multimedia download, particularly movie download, difficult. Another model is the "pre-recorded" model, i.e. pre-recorded multimedia library (PML) has been recorded in a mobile mass storage (i.e. mass storage used in a mobile device) before it is distributed to a user. Here, the word "LIBRARY" means that the mobile mass storage contains not just a small quantity of multimedia contents, but a quantity large enough so that a user can access as much multimedia contents as possible anytime anywhere.

PML places stringent requirements on the mobile mass storage in storage capacity, physical size, cost, power consumption and reliability. Take pre-recorded movie library (PmL) as an example. With each movie occupying ~500 MB space, a PmL containing even 100 movies requires ~50 GB space. In addition, the size of the mobile mass storage needs to be small, e.g. preferably no larger than a compact-flash (CF) card. Furthermore, the average storage cost per movie should be small, preferably comparable to the conventional means. In the conventional means, DVD is used to distribute movies and its average storage cost per movie ranges from $0.30 to $0.70. These stringent requirements cannot be met by any of existing semiconductor storage technologies. To overcome this and other difficulties, the present invention discloses a multimedia three-dimensional memory module (M3DMM).

OBJECTS AND ADVANTAGES

It is a principle object of the present invention to satisfy the mobile user's desire to access as much multimedia contents as possible anytime anywhere.

It is a principle object of the present invention to satisfy the mobile user's desire to access as much movies as possible anytime anywhere and at a reasonable price.

It is a further object of the present invention to protect both interests of consumers and copyright owners.

It is a further object of the present invention to lower the entry barrier for pre-recorded multimedia library.

In accordance with these and other objects of the present invention, the present invention discloses a multimedia three-dimensional memory module (M3DMM).

SUMMARY OF THE INVENTION

The present invention follows a "pre-recorded" model to distribute multimedia contents. Pre-recorded multimedia library (PML) places stringent requirements on the mobile mass storage (i.e. mass storage used in a mobile device) in storage capacity, physical size, cost, power consumption and reliability. Take pre-recorded movie library (PmL) as an example. With each movie occupying ~500 MB space, a PmL containing even 100 movies requires ~50 GB space. In addition, the size of the mobile mass storage needs to be small, e.g. preferably no larger than a compact-flash (CF) card. Furthermore, its average storage cost per movie should be small, preferably comparable to the conventional means. In the conventional means, DVD is used to distribute movies and its average storage cost per movie ranges from $0.30 to $0.70. With the advent of three-dimensional memory module (3D-MM, referring to U.S. Patent Application No. 60/767,573), these stringent requirements can be met. Accordingly, the present invention discloses a multimedia 3D-MM (M3DMM).

Figure 1:
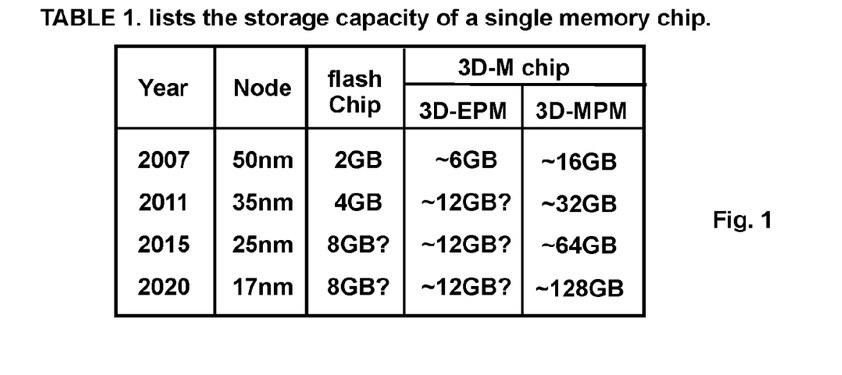
FIG. 1 (Table 1) lists the storage capacity of a single memory chip.
Figure 4:
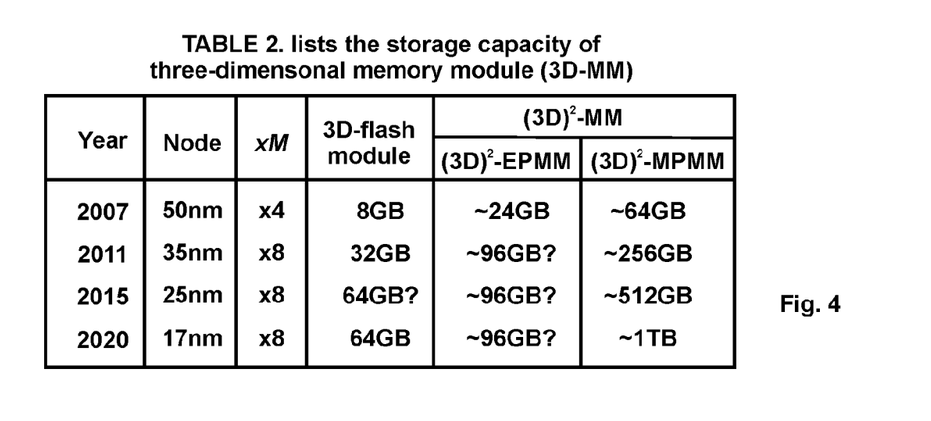
FIG. 4 (Table 2) lists the storage capacity of a three-dimensional memory module (3D-MM)

An M3DMM is a three-dimensional memory module (3D-MM) containing a pre-recorded multimedia library (PML). Here, 3D-MM is a semiconductor memory module comprising a plurality of vertically stacked memory chips. By convention, a 3D-MM comprising $M (\geqq 2)$ chips is denoted as xM 3D-MM. For example, an x8 3D-MM comprises eight vertically stacked chips. Compared with a single-chip module (i.e. each module containing a single memory chip, referring to FIG. 1/Table 1 for single-chip storage capacity, where "~" means an estimated value, "?" means it is questionable to scale down to this node), 3D-MM can achieve significant increase in storage capacity (FIG. 4/Table 2) in just a slightly larger space, i.e. with almost the same footprint and a slightly larger thickness. In addition, 3D-MM is more power efficient and more reliable than other mass storage means (e.g. hard-disk drive or optical drive). All these attributes make 3D-MM an ideal storage candidate for the PML.

Figure 6:
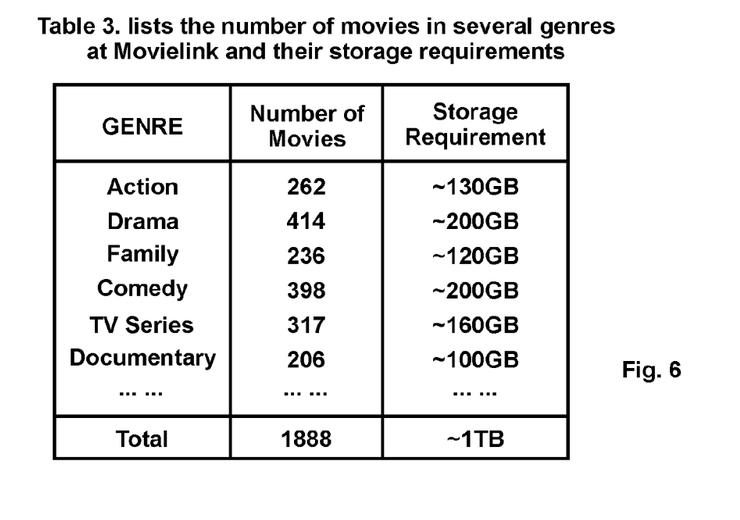
FIG. 6 (Table 3) lists the number of movies in several genres at Movielink (http://www.movielink.com) and their storage requirements.

One type of M3DMM of particularly importance is $(3D)^2$-MM. $(3D)^2$-MM is an M3DMM comprising a plurality of vertically stacked 3D-M chips; and 3D-M is a semiconductor memory chip comprising a plurality of vertically stacked memory levels. Among all semiconductor storage technologies, $(3D)^2$-MM, particularly mask-programmable $(3D)^2$-MM, has the largest storage capacity (Table 2) and is the only one that can store a pre-recorded movie library (PmL) at a reasonable price. Its average storage cost per movie is comparable to the conventional means—DVD, whose average storage cost per movie ranges from $0.30 to $0.70. For example, at the 50 nm node, an x4 $(3D)^2$-MPMM can store ~64 GB, or ~120 movies, with average storage cost per movie ~$0.40; at the 17 nm node, an x8 $(3D)^2$-MPMM can store ~1 TB, enough for all movies at Movielink (FIG. 6/Table 3), with average storage cost per movie ~$0.05. This is unimaginable for any of the existing semiconductor storage technologies.

Because a PML contains a large amount of copyrighted contents, if full access is granted at the moment of distribution, a user will be charged a hefty upfront fee for the copyrights of all contents therein. Apparently, the user is not willing to pay copyright fees for the contents he is not interested in. To protect both interests of consumers and copyright owners, access to the PML should be controlled in such a way that a user only pays when he accesses.

With access control, hardware cost can be distributed through access fees and therefore, a user can obtain the hardware (e.g. M3DMM) at a nominal price. This will lower the entry barrier for the M3DMM. To further lower the entry barrier, an M3DMM system can also contain advertisements. A user will be charged a reduced access fee if advertisement playback is accepted during content playback.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

The present invention follows a "pre-recorded" model to distribute multimedia contents. Pre-recorded multimedia library (PML) places stringent requirements on the mobile mass storage (i.e. mass storage used in a mobile device) in storage capacity, physical size, cost, power consumption and reliability. Take pre-recorded movie library (PmL) as an example. With each movie occupying ~500 MB space, a PmL containing even 100 movies requires ~50 GB space. In addition, the size of the mobile mass storage needs to be small, e.g. preferably no larger than a compact-flash (CF) card. Furthermore, its average storage cost per movie should be small, preferably comparable to the conventional means. In the conventional means, DVD is used to distribute movies and its average storage cost per movie ranges from $0.30 to $0.70. With the advent of three-dimensional memory module (3D-MM, referring to U.S. Patent Application No. 60/767,573), these stringent requirements can be met. Accordingly, the present invention discloses a multimedia 3D-MM (M3DMM).

An M3DMM is a three-dimensional memory module (3D-MM) containing a pre-recorded multimedia library (PML). Here, 3D-MM is a semiconductor memory module comprising a plurality of vertically stacked memory chips. By convention, a 3D-MM comprising $M (\geq 2)$ chips is denoted as xM 3D-MM. For example, an x8 3D-MM comprises eight vertically stacked chips. Compared with a single-chip module (i.e. each module containing a single memory chip, referring to FIG. 1/Table 1 for single-chip storage capacity, where "~" means an estimated value, "?" means it is questionable to scale down to this node), 3D-MM can achieve significant increase in storage capacity (FIG. 4/Table 2) in just a slightly larger space, i.e. with almost the same footprint and a slightly larger thickness. In addition, 3D-MM is more power efficient and more reliable than other mass storage means (e.g. hard-disk drive or optical drive). All these attributes make 3D-MM an ideal storage candidate for the PML.

Figure 2:
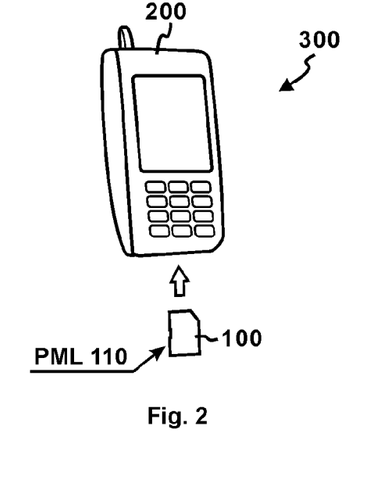
FIG. 2 illustrates a preferred M3DMM system.

FIG. 2 illustrates a preferred mobile playback system associated with the M3DMM, or M3DMM system 300. It comprises an M3DMM 100 and a mobile device 200. The M3DMM 100 contains a pre-recorded multimedia library (PML) 110. The mobile device 200 plays back selected multimedia contents from the PML 110. A preferred mobile device 200 is cellular phone. The M3DMM 100 can be removable from the mobile device 200 or embedded into the mobile device 200.

Figure 3:
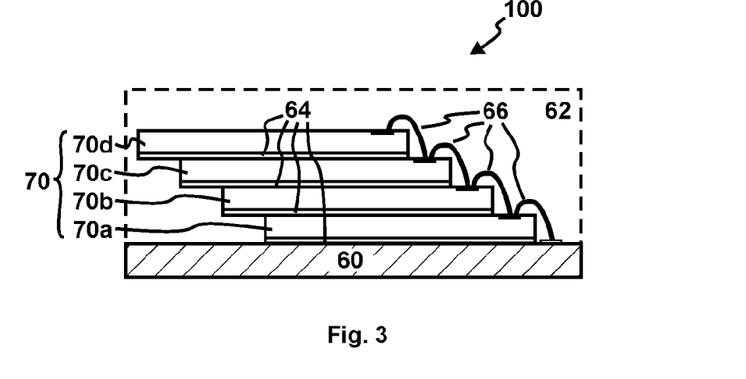
FIG. 3 is a cross-sectional view of a preferred 3D-MM.

FIG. 3 is a cross-sectional view of a preferred 3D-MM 100. It comprises a chip stack 70 attached to a substrate 60. The chip stack 70 comprises a plurality of vertically stacked memory chips 70a-70d. The memory chips in the chip stack 70 are attached to each other by adhesive layer 64, and make electrical contact to each other through bond wires 66. The whole module is encapsulated in a molding compound 62.

The preferred 3D-MM 100 in FIG. 3 is an offset 3D-MM. To those skilled in the art, other forms of 3D-MM 100 may also be used, e.g. rotated 3D-MM, spacer-separated 3D-MM, single-sided 3D-MM, double-sided 3D-MM, wire-bonded 3D-MM, flip-bonded 3D-MM, hybrid-bonded 3D-MM, through-silicon-via-based 3D-MM, edge-contact-based 3D-MM, and package-stacked 3D-MM. More details of 3D-MM are disclosed in the co-pending U.S. Patent Application No. 60/767,573, "Three-Dimensional Memory Module (3D-MM) Excelling Contemporary Micro-Drive (CMD)", filed Aug. 30, 2006.

One type of M3DMM of particularly importance is $(3D)^2$-MM. $(3D)^2$-MM is an M3DMM comprising a plurality of vertically stacked 3D-M chips; and 3D-M is a semiconductor memory chip comprising a plurality of vertically stacked memory levels. 3D-M can be electrically-programmable (3D-EPM) or mask-programmable (3D-MPM). More details on 3D-M are disclosed in U.S. Pat. No. 5,835,396 and others.

Figure 5A:
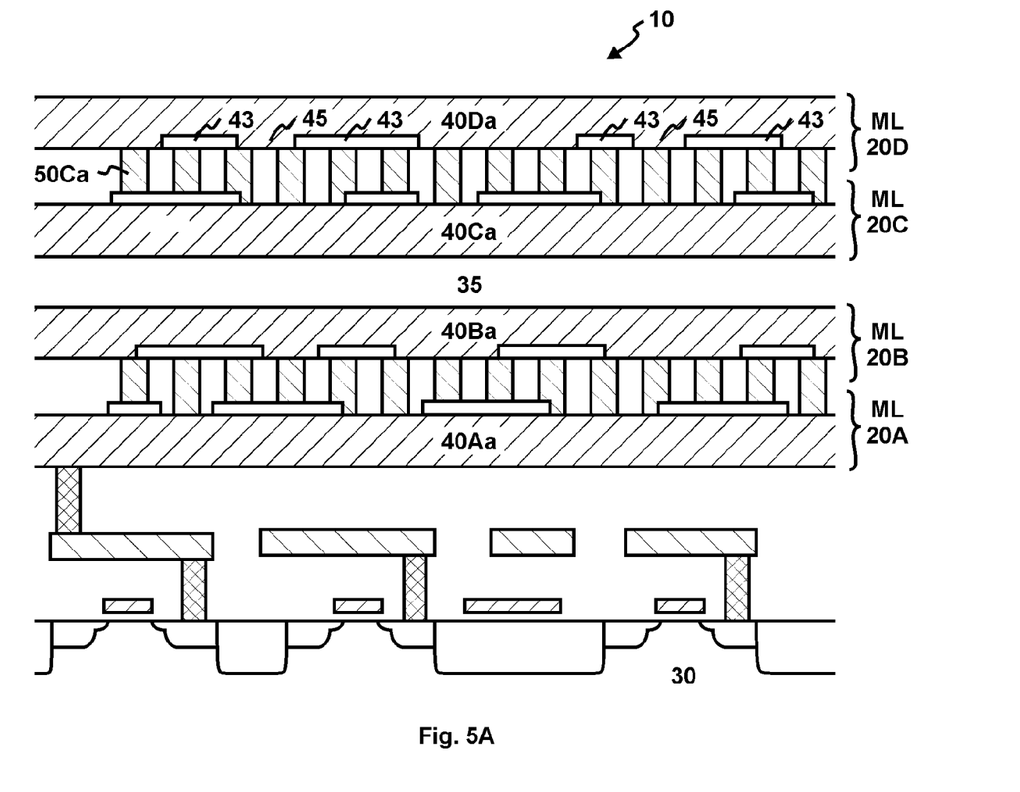
FIG. 5A is a cross-sectional view of a three-dimensional memory (3D-M) chip.

FIG. 5A is a cross-sectional view of a preferred 3D-M 10. This preferred embodiment is a 3D-MPM. It comprises four memory levels 20A-20D, which are stacked above each another. These memory levels are further stacked above a substrate 30. Each memory level (e.g. 20D) comprises word lines (e.g. 40Da), bit lines (e.g. 50Ca) and info-dielectric 43. Memory cells are located at the intersection between word lines and bit lines. The existence or absence of openings 45 in the info-dielectric 43 determines the information stored in memory cells.

This preferred embodiment uses a number of ways to increase the storage capacity and lower the manufacturing cost, including: 1) nF-opening (n>1), i.e. the dimension of the opening 45 is larger than the width F of the address line (e.g. 50Ca) (referring to U.S. Pat. No. 6,903,427); 2) N-ary MPM (N>2), i.e. each MPM cell has N possible states and stores more than one bit (referring to U.S. patent application Ser. No. 11/162,262); 3) hybrid-level 3D-M, i.e. some adjacent memory levels share address lines (e.g. memory levels 20C, 20D share address line 50Ca), while other adjacent memory levels do not (e.g. memory levels 20B, 20C are separated by an inter-level dielectric 35) (referring to China, P.R. Patent Application 200610162698.2).

Among all semiconductor storage technologies, $(3D)^2$-MM, particularly mask-programmable $(3D)^2$-MM (i.e. $(3D)^2$-MPMM, which is a $(3D)^2$-MM comprising a plurality of vertically stacked 3D-MPM chips), has the largest storage capacity (Table 2) and is the only one that can store a pre-recorded movie library (PmL) at a reasonable price. Its average storage cost per movie is comparable to the conventional means—DVD, whose average storage cost per movie ranges from $0.30 to $0.70. For example, at the 50 nm node, an x4 $(3D)^2$-MPMM can store ~64 GB, or ~120 movies, with average storage cost per movie ~$0.40; at the 17 nm node, an x8 $(3D)^2$-MPMM can store ~1 TB, enough for all movies at Movielink (FIG. 6/Table 3), with average storage cost per movie ~$0.05. This is unimaginable for any of the existing semiconductor storage technologies.

Figure 5B:
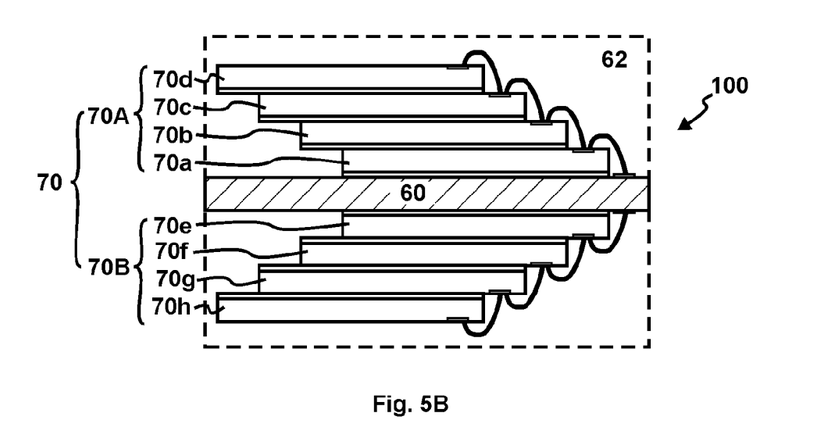
FIG. 5B is a cross-sectional view of a preferred $(3D)^2$-MM (i.e. 3D-M-based M3DMM)

FIG. 5B is a cross-sectional view of a preferred $(3D)^2$-MM. This preferred embodiment is an x8 $(3D)^2$-MM, which comprises 8 memory chips. It further comprises two chip sets 70A, 70B, each located on one side of the substrate 60. To maximize its capacity, all eight chips 70a-70h are 3D-M chips. $(3D)^2$-MM can be categorized into $(3D)^2$-EPMM (i.e. 3D-EPM-based M3DMM) and $(3D)^2$-MPMM (i.e. 3D-MPM-based M3DMM).

Because a PML 110 contains a large amount of copyrighted contents, if full access is granted at the moment of distribution, a user will be charged a hefty upfront fee for the copyrights of all contents therein. Apparently, the user is not willing to pay copyright fees for the contents he is not interested in. To protect both interests of consumers and copyright owners, access to the PML 110 should be controlled in such a way that a user only pays when he accesses.

Figure 7:
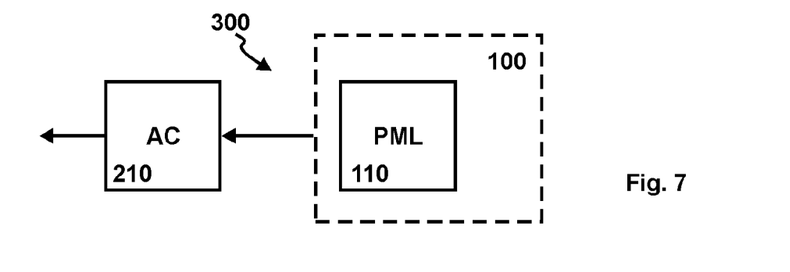
FIG. 7 is a simplified block diagram of the preferred M3DMM system.

FIG. 7 is a simplified block diagram of the preferred M3DMM system 300. It comprises an M3DMM 100 and an access-control block (AC) 210. The AC 210 controls access to the PML 110 in the M3DMM 100. To protect copyright, content data are preferably encrypted. The M3DMM system 300 keeps track of an account balance (b), which records credit from payment and debit from usage. The AC 210 can be physically located in the M3DMM 100 (referring to FIG. 13A), or in the mobile device 200 (referring to FIG. 13B). Another possibility is that a portion of AC 210 is physically located in the mobile device 200, with the remaining portion located in the M3DMM 100.

Figure 8:
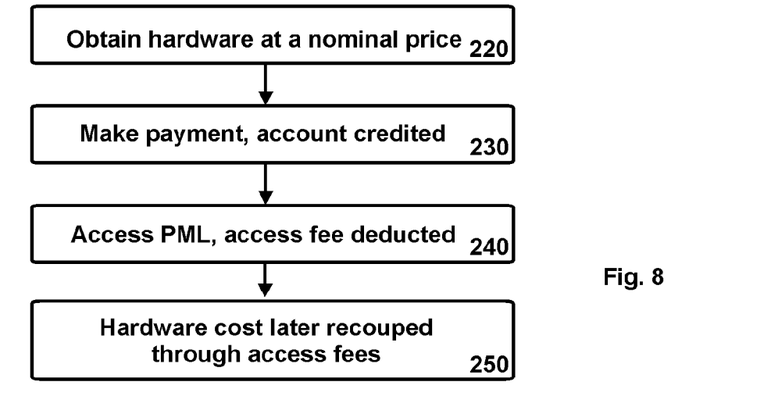
FIG. 8 illustrates a preferred access method.

FIG. 8 illustrates a preferred access method. It comprises a payment process 230 and a playback process 240. During the payment process 230, a user makes payment and his account is credited. During the playback process 240, the user accesses selected contents in the PML 110 and corresponding access fees are deducted from his account. Because access fees include not only the copyright fees, but also a portion of the hardware cost, the user could pay a nominal price for the M3DMM 100 (step 220), and the hardware cost can later be recouped from access fees (step 250). This can lower the entry barrier for the PML 110.

Figure 9A:
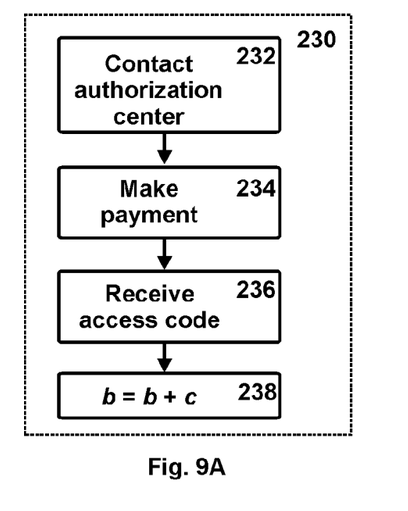
FIG. 9A illustrates a preferred payment process.

FIG. 9A illustrates a preferred payment process 230. At first, the user contacts an authorization center (step 232). After the user makes payment (step 234), the authorization center issues an access code (step 236), which results in an addition of the credit (c) to the account balance, i.e. b=b+c (step 238).

Figure 9B:
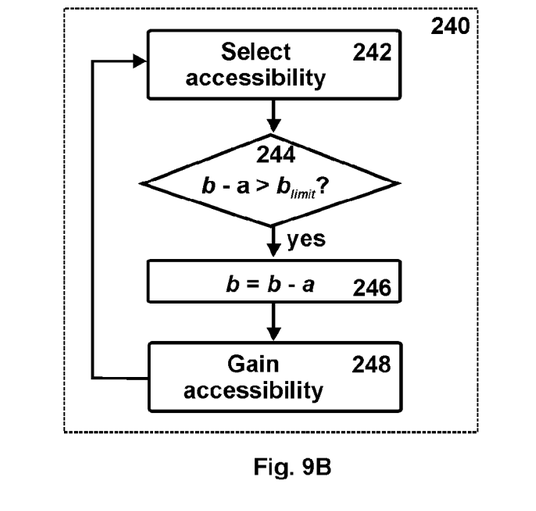
FIG. 9B illustrates a preferred playback process.

FIG. 9B illustrates a preferred playback process 240. At first, the user selects the desired accessibility (step 242). Then the remaining balance will be calculated, which is the difference between the existing balance and the access fee (a). As long as the remaining balance is above a threshold $b_{limit}$ (step 244), the user can obtain the desired accessibility (step 248) and the corresponding access fee is deducted from the account balance, i.e. b=b−a (step 246). Note that payment process 230 can occur before the playback process 240 (like a pre-paid phone card, or debit card), or after the playback process 240 (like a credit card).

In FIGS. 8-9B, the account balance is stored in the M3DMM system 300. Only during the payment process 230, does the M3DMM system 300 need to contact the authorization center. Because the authorization center is located remotely, this contact process needs to be carried out by a telecommunication means, such as telephone (landline or cellular) or internet (wired or wireless). During the playback process 240, the M3DMM system 300 can determine a user's accessibility on its own and does not need to rely on any telecommunication means. Because the payment process 230 only occurs occasionally (e.g. monthly), the preferred M3DMM system 300 and its associated access method work almost all time even in areas where no telecommunication means is available.

To facilitate the payment process 230, the mobile device 200 in the M3DMM system 300 preferably uses a cellular phone. Cellular phone provides several advantages: 1) cellular communication has the widest coverage; 2) a user does not need to punch in numbers for device ID and credit card, because device ID can be directly transmitted from the cellular phone to the authorization center and payment can be directly deducted from the cellular account.

Figure 10:
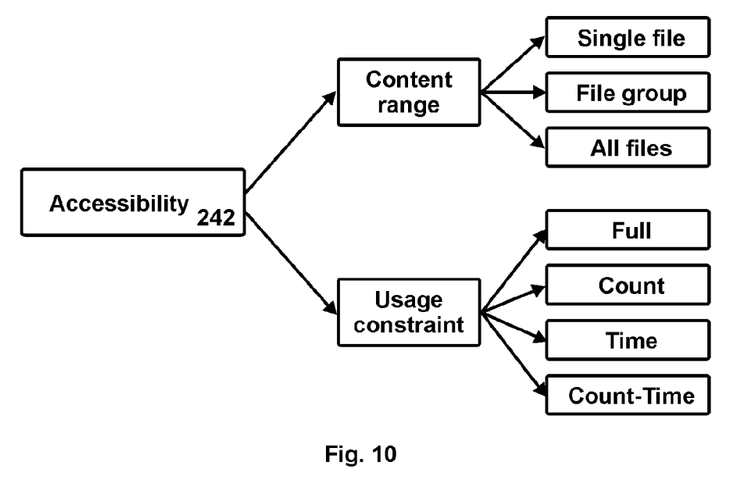
FIG. 10 illustrates a preferred sequence to select accessibility.

FIG. 10 illustrates a preferred sequence to select accessibility (step 242). It comprises two steps: the first step is to select content range; the second step is to select usage constraint. The content range could be a single file, a file group or all files in the PML 110; the usage constraint could be full-access (i.e. unlimited playback), count-limited (i.e. the number of playbacks not to exceed a limit), time-limited (i.e. playback must occur within a specified period), count-time-limited (i.e. the number of playbacks within a period not to exceed a limit).

Figure 11:
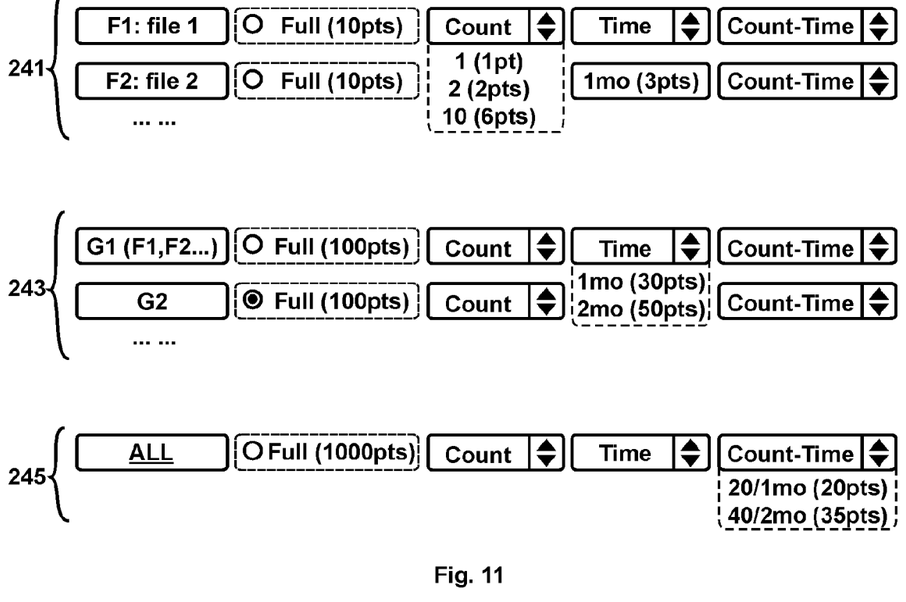
FIG. 11 illustrates a preferred user interface to select accessibility.

FIG. 11 illustrates a preferred user interface to select accessibility. It comprises three sections 241, 243, 245. They correspond to single file, file group or all files, respectively. For example, in section 241, a user selects the usage constraint for file F1. When he clicks "Count", a pull-down menu displays three choices: "1 (1 pt)", "2 (2 pts)", "10 (6 pts)", which means if the user selects to playback F1 once, the access fee is 1 point; to playback F1 twice, the access fee is 2 points; to playback F1 for ten times, the access fee is 6 points.

Figure 12:
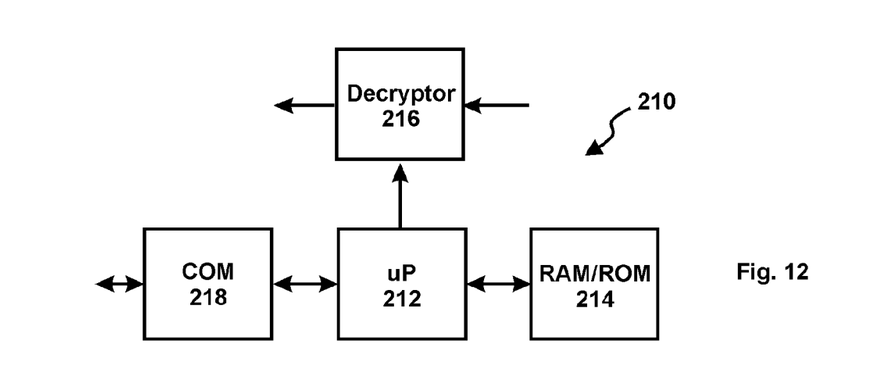
FIG. 12 is a block diagram of a preferred access-control block.

FIG. 12 is a block diagram of a preferred access-control block (AC) 210. It comprises micro-processor 212, memory (including RAM and ROM) 214, decryptor 216 and communication means (COM) 218. ROM 214 stores information such as device ID, account balance, access fees and encryption keys. Some of these information can also be stored in the M3DMM 100. Micro-processor 212 determines whether a user is allowed to access a certain content. If allowed, the corresponding encryption key will be sent to the decryptor 216. The COM 218 provides information exchange between the M3DMM system 300 and the authorization center. It could be telephone (landline or cellular), internet (wired or wireless) or others.

Figure 13A:
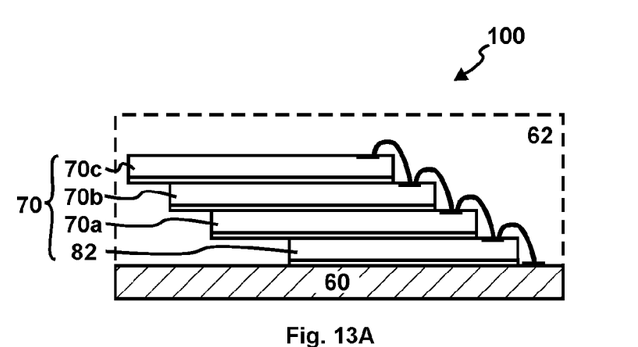
FIG. 13A is a cross-sectional view of a preferred combo-M3DMM.

FIG. 13A is a cross-sectional view of a preferred combo-M3DMM. Its chip stack 70 not only comprises memory chips 70a-70c, but also at least one non-memory chip 82. The non-memory chip could comprise an access-control (AC) chip, which comprises the AC block 210 of FIG. 13. It could also comprise a decoder chip or a digital-to-analog chip. Because they are housed in the same M3DMM 100 and preferably encapsulated with molding compound(s) 62, the information exchange between the non-memory chip 82 and the memory chips 70a-70c is protected. It would be difficult for pirates to break the copyright protection. To further reduce the chance of break-in, the non-memory chip 82 is preferably located between at least one memory chip (e.g. 70a-70c) and the substrate 60. Because it is not exposed to the external environment, the non-memory chip 82 would be very difficult to be tampered with.

Figure 13B:
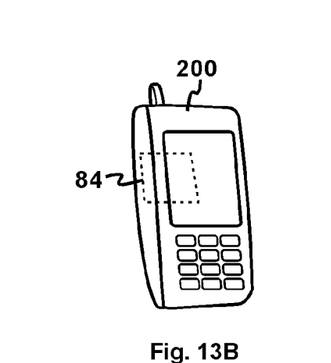
FIG. 13B illustrates a preferred M3DMM system with a standalone access control.

FIG. 13B illustrates a preferred M3DMM system with a standalone access control. The mobile device 200 comprises an access-control (AC) chip 84, which comprises the AC block of FIG. 13. In this preferred embodiment, content data in the PML 110 are encrypted and the M3DMM's used by the mobile device 200 do not have to comprise an AC block 210.

Figure 14:
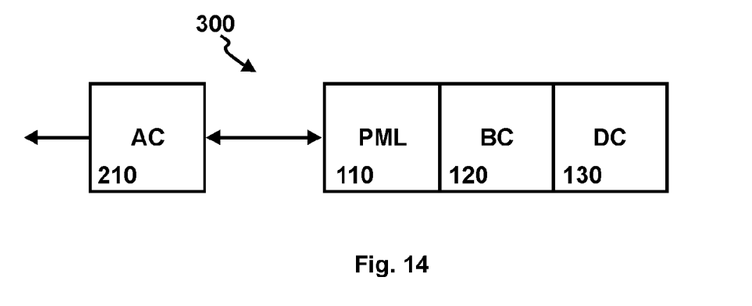
FIG. 14 is a simplified block diagram of the preferred M3DMM system containing multi-sourced multimedia library.

FIG. 14 is a simplified block diagram of a preferred M3DMM system containing multi-sourced multimedia library 300. Its contents come from various sources. To be more specific, besides PML 110, the M3DMM system 300 further contains broadcast contents (BC) 120 and/or downloaded contents (DC) 130. The BC 120 are delivered by broadcast means, e.g. radio signals, TV signals, wireless internet, cellular phone, wired internet or others. They typically comprise latest released movies, songs or books. The DC 130 are downloaded by user, e.g. from internet. They can be tailored to suit a user's individual needs. The BC 120 and DC 130 are preferably stored in a read-write memory (e.g. flash). It can be integrated with the M3DMM 100, or separately located in the mobile device 200.

The M3DMM system containing multi-sourced contents 300 can be easily implemented in a multimedia cellular phone. The multimedia cellular phone uses M3DMM 100 to access PML (e.g. movies) 110, while using cellular communication to get the recent release. The cellular communication can also carry out the payment process 230 for the PML 110. The multimedia cellular phone combines both strengths of the "download" and "pre-recorded" models for multimedia distribution and therefore, will be a most preferred M3DMM system in the future.

With access control, hardware cost can be distributed through access fees and therefore, a user can obtain the hardware (e.g. M3DMM 100) at a nominal price. This will lower the entry barrier for the M3DMM 100. To further lower the entry barrier, the M3DMM system 300 can also contain advertisements. A user will be charged a reduced access fee if advertisement playback is accepted during content playback.

Figure 15:
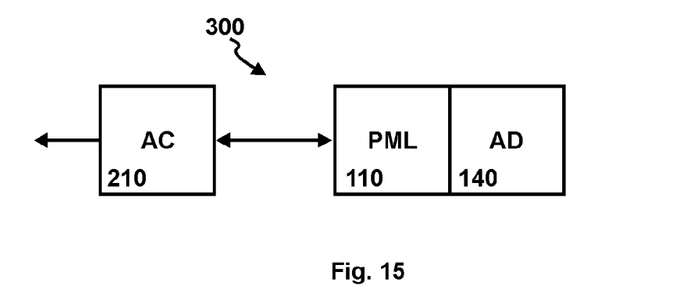
FIG. 15 is a simplified block diagram of the preferred M3DMM system containing advertisements (M3DMM+AD)

FIG. 15 is simplified a block diagram of a preferred M3DMM system 300 containing advertisements (M3DMM+AD) 100. Besides PML 110, the M3DMM system 300 also contains advertisements (AD) 140. The AD 140 can be located in the M3DMM 100, or separately in the mobile device 200. This preferred M3DMM system 300 further comprises an access-control block (AC) 210, which controls access to PML 110 and AD 140.

Figure 16A:
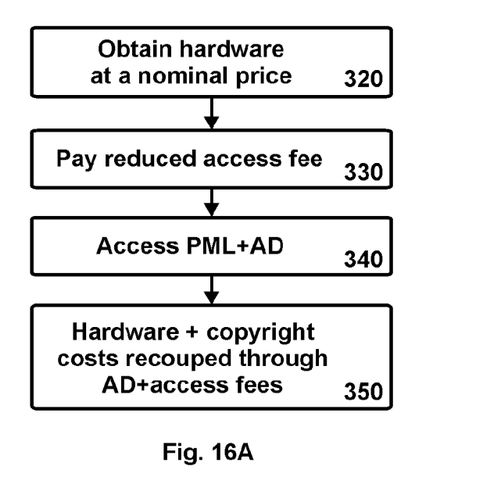
FIGS. 16A-16B illustrate two preferred access methods for the preferred M3DMM+AD.
Figure 16B:
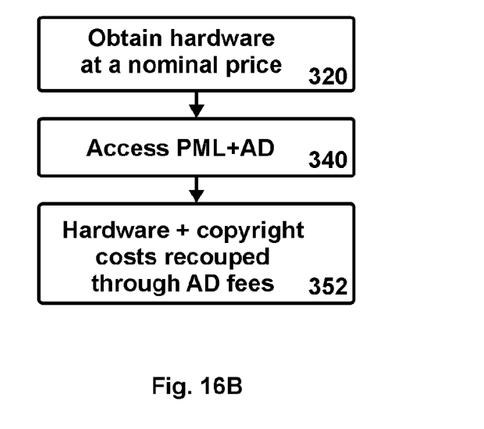

FIGS. 16A-16B illustrate two preferred access methods for the preferred M3DMM+AD 300. In FIG. 16A, the user first obtains hardware at a nominal price (step 320). During usage, the user pays reduced access fees (step 330) and advertisements are played with selected contents (step 340). The hardware and copyright costs are recouped through both advertisement and access fees (step 350). In FIG. 16B, enough advertisements are played with selected contents so that the user does not need to pay access fee (step 340). The hardware and copyright costs are recouped through the advertisement fees (step 352).

Figure 17:
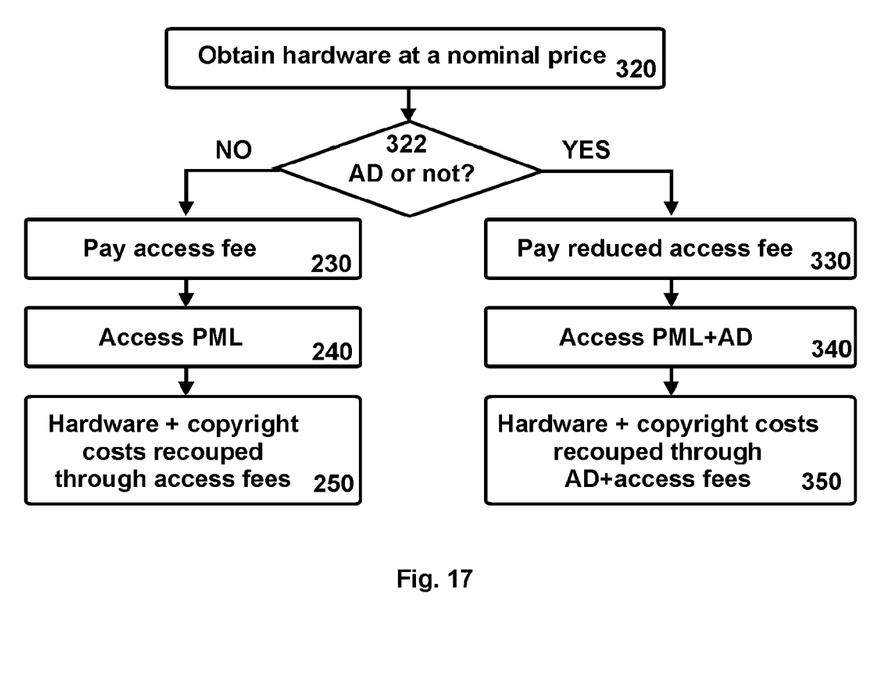
FIG. 17 illustrates a preferred user-configurable access method for the preferred M3DMM+AD.

FIG. 17 illustrates a preferred user-configurable access method for the preferred M3DMM+AD 300. Before usage, a user is inquired about "advertisement or not?" (step 322). If the answer is "YES", the user pays the reduced access fee (step 330); advertisements are played with contents (step 340); and the hardware and copyright costs are recouped through both advertisement and access fees (step 350). Apparently, as in FIG. 16B, enough advertisements can be played so that the user does not have to pay access fee. If the answer is "NO", the user pays the full access fee (step 230); no advertisements are to be played (step 240); and the hardware and copyright costs are recouped through access fees (step 250).

Figure 18:
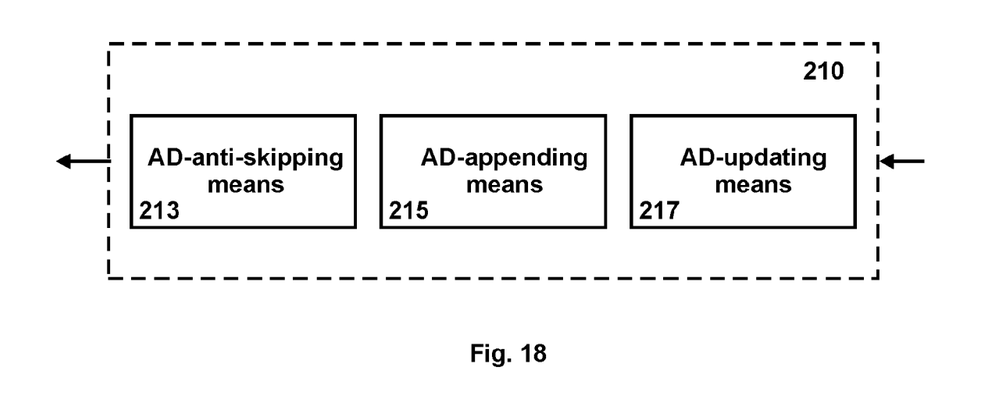
FIG. 18 illustrates several more functions of a preferred access-control block for the preferred M3DMM+AD.

In the preferred embodiment of FIG. 18, the AC 210 further comprises an ad-anti-skipping means 213, an ad-appending means 215 and/or an ad-updating means 217. The ad-anti-skipping means 213 ensures that the selected advertisement is played in full, e.g. cannot be skipped by fast-forwarding. The ad-appending means 215 selects an advertisement based on advertiser's request (e.g. advertiser may request to append his advertisement to a specific genre of movies) and appends it to the video under-play. The ad-updating means 217 updates advertisements periodically. Ad-updating can be delivered by broadcast means, e.g. radio signals, TV signals, wireless internet, cellular phone, wired internet or others. It typically occurs around mid-night, or at times when channel usage is not busy. With ad-updating, more advertisers can be accommodated, local advertisements can be delivered, and advertisements can be kept current.

Figure 19:
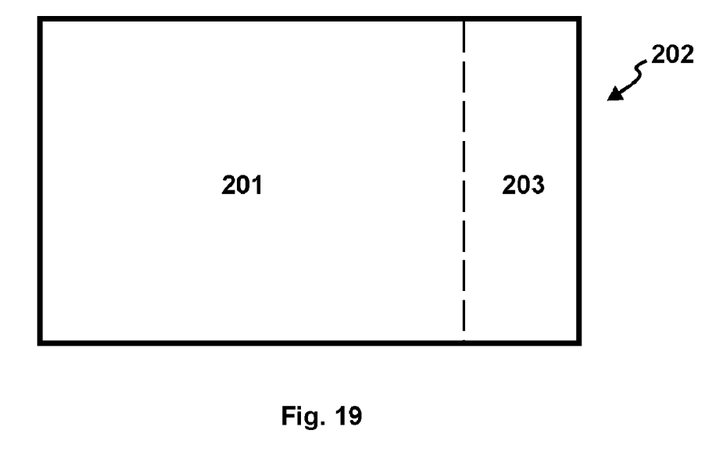
FIG. 19 illustrates a preferred hybrid display for contents and advertisements.

Referring now to FIG. 19, a preferred hybrid display 202 is disclosed. It comprises two windows 201, 203. Selected content is displayed in window 201, while advertisement is displayed in window 203. Contrary to the conventional method where advertisements are played between content segments, they can be played at the same time as selected contents. As a result, more advertisers can be accommodated and more advertisement revenue can be generated. This, in turn, will further reduce the access fees.

Figure 20:
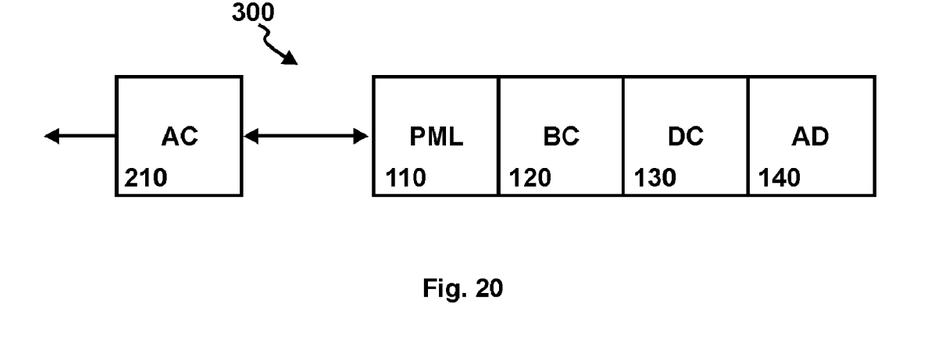
FIG. 20 is a simplified block diagram of a preferred M3DMM system containing multi-sourced multimedia library and advertisements.

FIG. 20 is a simplified block diagram of a preferred M3DMM system containing multi-sourced multimedia library and advertisements 300. Similar to FIG. 14, it contains PML 110, broadcast contents (BC) 120, downloaded contents (DC) 130 and advertisements (AD) 140. This preferred M3DMM system 300 further comprises an access-control block (AC) 210, which controls access to PML 110, BC 120, DC 130 and AD 140. The AD 140 can be played not only with PML 110, but also with BC 120 and DC 130. This result in a reduced access fee for BC 120 and DC 130.

Figure 21:
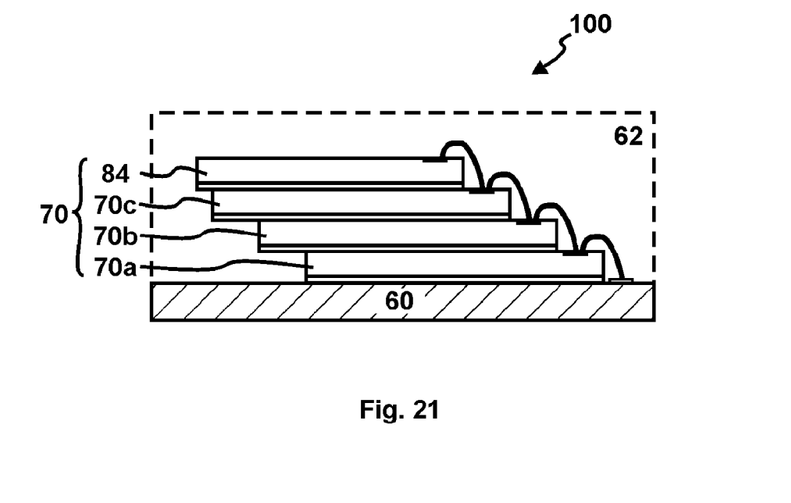
FIG. 21 is a cross-sectional view of a preferred hybrid-M3DMM.

FIG. 21 is a cross-sectional view of a preferred hybrid-M3DMM 100. Its chip stack 70 comprises at least two types of memory chips. The first type of memory chips 70a-70c could be 3D-M (e.g. 3D-MPM). With a large capacity and low cost per content, 3D-MPM chips 70a-70c can be used to store a PML, more particularly PmL. The second type of memory chip 84 is a read-write memory (e.g. flash or 3D-EPM). Being writable, it can be used to store BC 120, DC 130, AD 140, or other contents that require frequent updates.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A multimedia three-dimensional memory module (M3DMM) system, comprising:
    a three-dimensional memory module (3D-MM) comprising a plurality of vertically stacked memory chips, said 3D-MM containing a pre-recorded multimedia library (PML);
    an access-control means for controlling access to said PML; and
    a mobile device for playing back selected multimedia contents from said PML.

2. The M3DMM system according to claim 1, wherein said 3D-MM comprises a plurality of three-dimensional memory (3D-M) chips.

3. The M3DMM system according to claim 2, wherein said 3D-M comprises three-dimensional electrically-programmable memory (3D-EPM) or three-dimensional mask-programmable memory (3D-MPM).

4. The M3DMM system according to claim 1, wherein said mobile device is a cellular phone.

5. The M3DMM system according to claim 1, wherein a user initially obtains said 3D-MM at a nominal price and later pays an access fee to access selected multimedia contents in said PML.

6. The M3DMM system according to claim 1, wherein said 3D-MM further comprises at least one non-memory chip located between at least one of said memory chips of said 3D-MM and the substrate of said 3D-MM.

7. The M3DMM system according to claim 1, wherein said 3D-MM further comprises a read-write memory.

8. The M3DMM system according to claim 1, further containing broadcast contents and/or downloaded contents.

9. The M3DMM system according to claim 1, further containing advertisements, whereby a user pays reduced access fee when advertisement playback is allowed during content playback.

10. The M3DMM system according to claim 9, further comprising a hybrid display, said hybrid display further comprising:
    a first window for displaying selected contents from said PML; and
    a second window for displaying advertisements.

11. The M3DMM system according to claim 1, further containing a pre-recorded textual library, a pre-recorded audio library, a pre-recorded image library and/or a pre-recorded video library.

12. A three-dimensional memory (3D-M)-based three-dimensional memory module ($(3D)^2$-MM), comprising:
    a plurality of vertically stacked three-dimensional memory (3D-M) chips, each of said 3D-M chips comprising a plurality of vertically stacked memory levels;
    wherein said $(3D)^2$-MM stores a pre-recorded movie library (PmL) at an average storage cost per movie comparable to or less than DVD.

13. The $(3D)^2$-MM according to claim 12, wherein said 3D-M comprises a three-dimensional mask-programmable memory (3D-MPM).

14. The $(3D)^2$-MM according to claim 12, wherein said average storage cost per movie is less than $0.70.

15. The $(3D)^2$-MM according to claim 12, wherein said PmL comprises at least 100 movies.

16. The $(3D)^2$-MM according to claim 12, further comprising an access-control means for controlling access to said PmL.

17. The $(3D)^2$-MM according to claim 12, wherein a user initially obtains said $(3D)^2$-MM at a nominal price and later pays an access fee to access selected movies in said PmL.

18. The $(3D)^2$-MM according to claim 12, further comprising a read-write memory.

19. The $(3D)^2$-MM according to claim 12, further containing advertisements, whereby a user pays reduced access fee when advertisement playback is allowed during content playback.

20. The $(3D)^2$-MM according to claim 12, further containing a pre-recorded textual library, a pre-recorded audio library, and/or a pre-recorded image library.

* * * * *